US006603345B2

(12) United States Patent
Takahashi

(10) Patent No.: US 6,603,345 B2
(45) Date of Patent: Aug. 5, 2003

(54) SEMICONDUCTOR DEVICE WITH REDUCED LEAKAGE OF CURRENT

(75) Inventor: Hiroyuki Takahashi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/033,628

(22) Filed: Dec. 28, 2001

(65) Prior Publication Data

US 2002/0084835 A1 Jul. 4, 2002

(30) Foreign Application Priority Data

Dec. 28, 2000 (JP) ....................................... 2000-400003

(51) Int. Cl.[7] ................................................ H03K 3/01
(52) U.S. Cl. ...................................................... 327/534
(58) Field of Search ................................ 327/530, 534, 327/535, 538, 540, 541, 544

(56) References Cited

U.S. PATENT DOCUMENTS 4,859,870 A * 8/1989 Wong et al. ................ 327/108
5,274,601 A * 12/1993 Kawahara et al. ..... 365/230.06
5,583,457 A * 12/1996 Horiguchi et al. .......... 326/121
5,614,847 A * 3/1997 Kawahara et al. ............ 326/98
5,880,623 A * 3/1999 Levinson .................... 327/540
6,049,245 A * 4/2000 Son et al. ................... 327/544
6,307,396 B1 * 10/2001 Mulatti et al. ................ 326/71

* cited by examiner

*Primary Examiner*—Jeffrey Zweizig
(74) *Attorney, Agent, or Firm*—Choate, Hall & Stewart

(57) ABSTRACT

The present invention provides a semiconductor device comprising: at least a circuit block including field effect transistors; and a potential supplying circuit supplying one of a predetermined power potential and a predetermined ground potential to the at least circuit block in an active mode, and the potential supplying circuit further shifting the one of the predetermined power potential and the predetermined ground potential to reduce a potential difference between the predetermined power potential and the predetermined ground potential for supplying the shifted potential to the at least circuit block in a static mode.

17 Claims, 11 Drawing Sheets

SEMICONDUCTOR DEVICE WITH REDUCED LEAKAGE OF CURRENT

BACKGROUND OF THE INVENTION

1. Field of the Invention

The present invention relates to a semiconductor device, and more particularly to a semiconductor device having active elements of MOS field effect transistors suitable for suppressing a band-to-band leak current and a sub-threshold current.

2. Description of the Related Art

Shrinkage of the semiconductor device needs to reduce the power voltage level. The reduction in thickness of the gate oxide film of the field effect transistor causes the increase in the intensity of electric field applied to the gate oxide film, resulting in a deterioration in quality of the gate oxide film. Shortening the gate length makes it difficult to ensure the withstand voltage between the source and drain. The shrinkage of the semiconductor device caused increased field intensities at various positions of the semiconductor device. In order to avoid the increase of the field intensities, it is necessary to reduce the power voltage in accordance with the scaling rule.

The reduction in thickness of the gate oxide film due to the shrinkage of the semiconductor device is likely to cause the band-to-band tunneling as the band-to-band leak current in the drain region of the MOS field effect transistor. This leak current is small as absolute value. The leak current is influence in the static mode of the semiconductor device such as the stand-by mode rather than the operational mode.

The band-to-band tunneling phenomenon is due to the fact that the bending of the energy band on the substrate surface in the vicinity of the drain region is larger than the band gap of silicon. The reduction of the power voltage is effective to suppress the band-to-band tunneling phenomenon. This reduction of the power voltage, however, makes it difficult to improve the desirable high speed performance of the semiconductor device.

An alternative counter-measure to suppress the band-to-band tunneling phenomenon has been proposed, which suppresses the impurity concentration of the drain region in the substrate surface for relaxing the field intensity in the drain region. This alternative counter-measure causes a disadvantage in that the resistance of the drain region is increased, whereby the current driving ability of the MOS field effect transistor is dropped, resulting in the difficulty in improvement of the high speed performance of the semiconductor device.

The reduction in the power voltage due to the scaling down of the semiconductor device also causes the drop in the voltage level of the control signal applied to the gate electrode of the MOS field effect transistor. The drop in the voltage level of the control signal applied to the gate electrode causes the drop of the drain current, whereby the high speed performance is deteriorated.

A counter-measure to avoid the drop of the operation speed of the semiconductor device has been proposed, wherein a gate threshold voltage is dropped to improve the current driving ability of the MOS field effect transistor. The drop of the gate threshold voltage increases the sub-threshold current, whereby the leak current is thus increased. This increased leak current is influential in the static mode such as the stand-by mode of the semiconductor device.

Further, the reduction in thickness of the gate oxide film due to the shrinkage of the semiconductor device increases the field intensity applied to the gate oxide film, which results in a possibility of causing the tunneling current. The tunneling current causes a leakage of current between the gate electrode and the source region or the drain region. This increased leak current is also influential in the static mode such as the stand-by mode of the semiconductor device.

In the above circumstances, the development of a novel semiconductor device free from the above problems is desirable.

SUMMARY OF THE INVENTION

Accordingly, it is an object of the present invention to provide a novel semiconductor device free from the above problems.

It is a further object of the present invention to provide a novel semiconductor device which exhibits an improved high speed performance under condition of a reduced power voltage level due to the shrinkage of the semiconductor device.

It is a still further object of the present invention to provide a novel semiconductor device which exhibits an improved high speed performance with reduced leakage of current The present invention provides a semiconductor device comprising: at least a circuit block including field effect transistors; and a potential supplying circuit supplying one of a predetermined power potential and a predetermined ground potential to the at least circuit block in an active mode, and the potential supplying circuit further shifting the one of the predetermined power potential and the predetermined ground potential to reduce a potential difference between the predetermined power potential and the predetermined ground potential for supplying the shifted potential to the at least circuit block in a static mode.

The above and other objects, features and advantages of the present invention will be apparent from the following descriptions.

BRIEF DESCRIPTION OF THE DRAWINGS

Preferred embodiment, according to the present invention will be described in detail with reference to the accompanying drawings.

DETAILED DESCRIPTION OF THE PREFERRED EMBODIMENTS

Figure 1A:
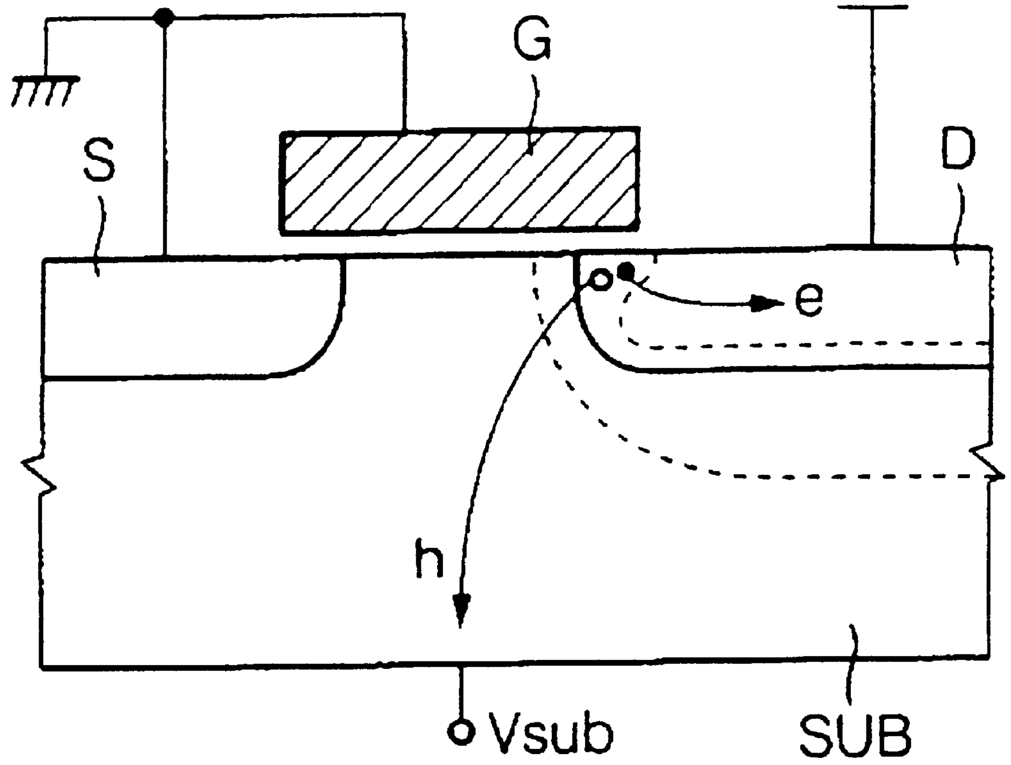
FIG. 1A is a fragmentary cross sectional elevation view illustrative of the n-channel MOS field effect transistor showing the band-to-band tunneling current.

A first aspect of the present invention is a semiconductor device comprising: at least a circuit block including field effect transistors; and a potential supplying circuit supplying one of a predetermined power potential and a predetermined ground potential to the at least circuit block in an active mode, and the potential supplying circuit further shifting the one of the predetermined power potential and the predetermined ground potential to reduce a potential difference between the predetermined power potential and the predetermined ground potential for supplying the shifted potential to the at least circuit block in a static mode.

In the static mode, the power potential or the ground potential is so shifted that a potential difference between the predetermined power potential and the predetermined ground potential for supplying the shifted potential to the circuit block, whereby a potential difference between the source and drain of the field effect transistor and a potential difference between the gate and drain of the field effect transistor are relaxed. For example, in the field effect transistor in OFF-state, suppressions can be obtained to the band-to-band leak current which depends on the field intensity between the gate and drain and also the sub-threshold current which depends on the source-drain voltage. In the active mode, the predetermined power potential or the predetermined ground potential is supplied to the circuit block. The effective suppression to the consumed current in the static mode can be obtained with allowing the high speed performance of the circuit block in the active mode.

The present invention makes it unnecessary to provide any additional counter-measure to the leak current. Even the power voltage is reduced due to the shrinkage of the semiconductor device, the suppression can be obtained to the consumed current in the static mode with allowing the high speed performance of the circuit block in the active mode. The shift of the power potential or the round potential may be adjusted depending on the structure of the circuit blocks thereby relaxing the field intensity to the field effect transistor for effective suppression to the leak current in the static mode.

The shift of the power potential or the ground potential may be realized by utilizing the forward characteristic of the diode, resulting in a reduction in potential difference between the power node and the around node of the circuit clock with keeping a high supply ability to supply a power current to the circuit block. Even the shift of the power potential or the ground potential is made to reduce the apparent power voltage to be supplied to the circuit block, the internal potentials of the circuit block are stable and also operational states of the circuit block are also stable. If in the active mode, no change appears to the input signals into the circuit block nor change appears to the internal signals, then the power node or the ground node in the active state may optically be shifted to suppress the consumed current by the circuit block.

It is possible that the potential supplying circuit shifts a source potential of first one of the field effect transistors, and the first one is in an OFF-state in the static mode, thereby reducing the potential difference between the source and the gate of the n-channel MOS field effect transistor which is in the OFF-state in the static mode as well as reducing the potential difference between the source and the gate of the p-channel MOS field effect transistor which is in the OFF-state in the static mode, which results in further suppression to the sub-threshold current of the transistors.

It is also possible that the potential supplying circuit further comprises: a current path between an internal ground node in the at least circuit block and an external ground terminal; an n-channel MOS field effect transistor being in an OFF-state in the static mode and also being in an ON-state in the active mode; and a diode having an anode connected to the ground node and a cathode connected to the external ground terminal. The n-channel MOS field effect transistor is controlled in ON-state, so as to suppress the predetermined ground potential to the around node of the circuit block. The n-channel MOS field effect transistor is controlled in OFF-state, so as to shift-up the ground potential by the barrier potential "V" of the diode. The potential difference between the power node and the ground node is reduced by the barrier potential "V" of the diode.

It is also possible that the potential supplying circuit further comprises: a current path between an internal power node in the at least circuit block and an external power terminal; a p-channel MOS field effect transistor being in an OFF-state in the static mode and also being in an ON-state in the active mode; and a diode having an anode connected to the external power terminal and a cathode connected to the power node. The p-channel MOS field effect transistor is controlled in ON-state, so as to suppress the predetermined power potential to the power node of the circuit block. The p-channel MOS field effect transistor is controlled in OFF-state, so as to shift-down the power potential by the barrier potential "V" of the diode. The potential difference between the power node and the ground node is reduced by the barrier potential "V" of the diode.

It is also possible that the circuit block comprises an array of memory cells, and the potential supplying circuit supplies a potential to one of a power node and a ground node of the memory cell for suppressing the leak current in the transistors in the static mode.

It is also possible that the array further includes a pre-charge circuit for pre-charging bit lines of the array, and the potential supplying circuit supplies a potential to a power node of the pre-charge circuit. Potentials of the bit lines connected to the pre-charge circuit are also shifted for suppression to the leak current of the transfer gate transistors connected to the bit lines.

It is also possible that the gate threshold voltages of the field effect transistors are set so high as to suppress a sub-threshold current, whereby allowing the current of the circuit block to flow into the diode side, which results in that the diode dominates the current path, whereby the power potential or the ground potential can accurately be shifted by the barrier potential the diode.

It is also possible that the potential supplying circuit supplies a substrate potential to the field effect transistor which has a source connected to one of a power node and a ground node of the at least circuit block. In the static mode, the substrate potential of the field effect transistor is shifted together with the ground node and the power node of the circuit block, whereby no variation nor change appears to the gate threshold voltage. This means that the state of the circuit block is stable in the static mode.

It is also possible that the circuit block has such a logic structure that a state of the circuit block is independent from conductive states of the field effect transistors in the static mode. The levels of the internal signals in the circuit block in the static state may be maintained at the same level as the signal levels in the active mode, whereby the circuit state of the circuit block is stable. In accordance with the relationship between the signal level and the shifted power or ground potential, the gate potential of the n-channel MOS field effect transistor is set lower than the source potential for suppressing the sub-threshold current.

The present invention suppresses the leakage of current due to the shrinkage of the semiconductor device with improving the high speed performance thereof. The leakage of current includes the band-to-band tunneling current, the sub-threshold current and the tunneling current through the gate oxide film.

The mechanisms of causing the band-to-band tunneling current, the sub-threshold current and the tunneling current through the gate oxide film will be described hereinafter by taking an example of the n-channel MOS field effect transistor.

FIG. 1A is a fragmentary cross sectional elevation view illustrative of the n-channel MOS field effect transistor showing the band-to-band tunneling current. The band-to-band tunneling current is caused if the field intensity is high applied to the overlap region between the drain region "D" and the gate electrode "G" of the n-channel MOS field effect transistor. The reduction in thickness of the gate oxide film due to the shrinkage of the semiconductor device makes it possible to cause the band-to-band tunneling current.

The gate "G" is grounded, whilst the drain "D" is applied with the power voltage, whereby a bias is applied between the gate "G" and the drain "D", wherein the n-channel MOS field effect transistor is in the OFF-state. A field intensity is increased at the position in the vicinity of the drain "D". The bend of the energy band on the silicon substrate surface becomes larger than the band gap of silicon, whereby electron-hole pairs are generated which cause the band-to-band leak current, wherein generated electrons are moved to the drain "D" and generated holes serve as substrate current. To suppress the band-to-band leak current, it is effective to reduce the potential difference between the gate "G" and the drain "D" for relaxing the field intensity. It is preferable to avoid that the substrate voltage Vsub is not excessively low.

Figure 1B:
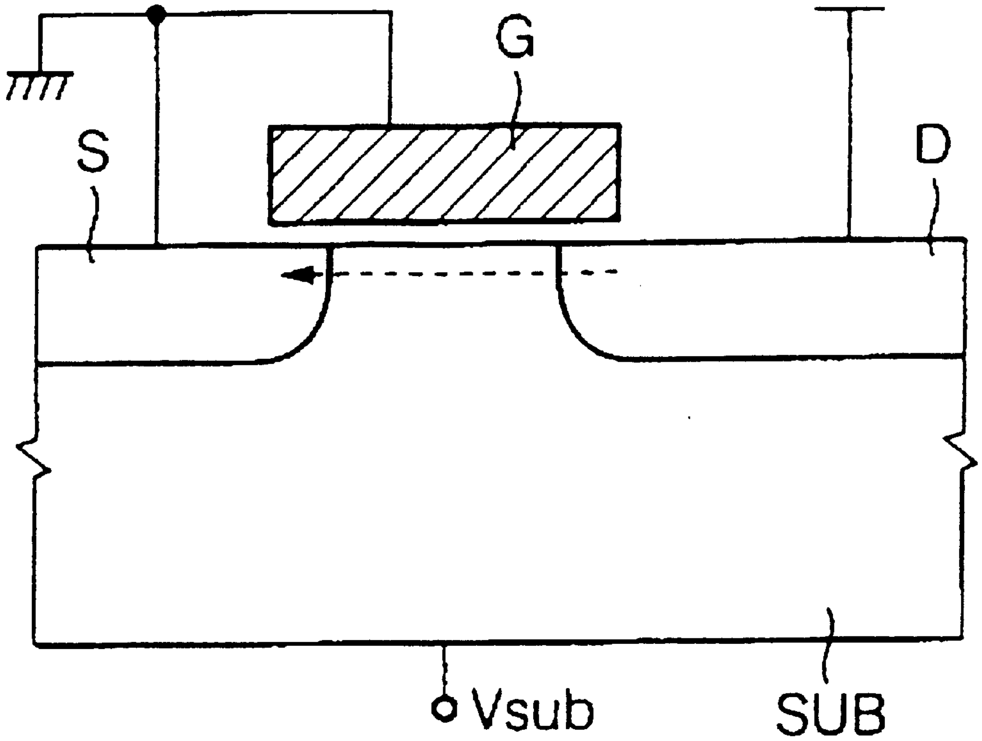
FIG. 1B is a fragmentary cross sectional elevation view illustrative of the n-channel MOS field effect transistor showing the sub-threshold current.

FIG. 1B is a fragmentary cross sectional elevation view illustrative of the n-channel MOS field effect transistor showing the sub-threshold current. The sub-threshold current is defined to be the current between the source "S" and the drain "D", which is caused when the potential difference between the gale "G" and the source "S" exceeds an effective threshold value. In order to suppress the sub-threshold current, it is effective to reduce the substrate voltage Vsub.

Figure 1C:
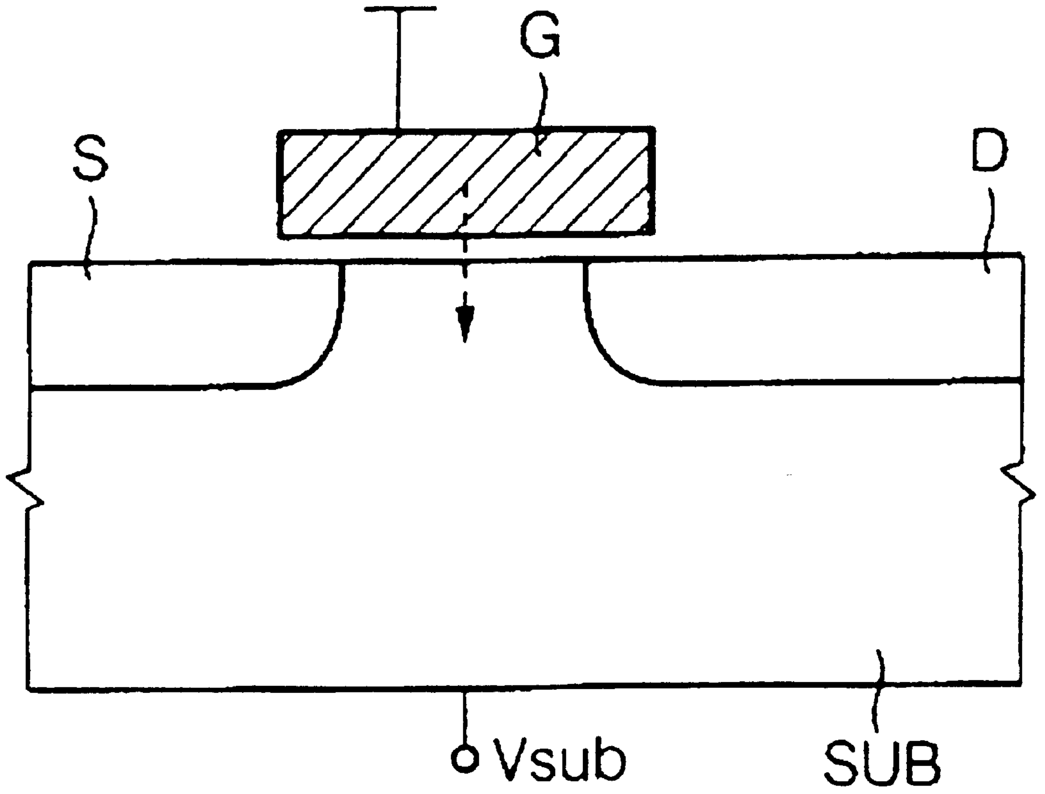
FIG. 1C is a fragmentary cross sectional elevation view illustrative of the n-channel MOS field effect transistor showing the tunneling current through the gate oxide film.

FIG. 1C is a fragmentary cross sectional elevation view illustrative of the n-channel MOS field effect transistor showing the tunneling current through the gate oxide film. The tunneling current through the gate oxide film between the gate "G" and the substrate "SUB" is caused when the field intensity applied to the gate oxide film is high. In order to suppress the tunneling current, it is preferable to avoid that the substrate voltage Vsub is not excessively low.

First Embodiment

Figure 2:
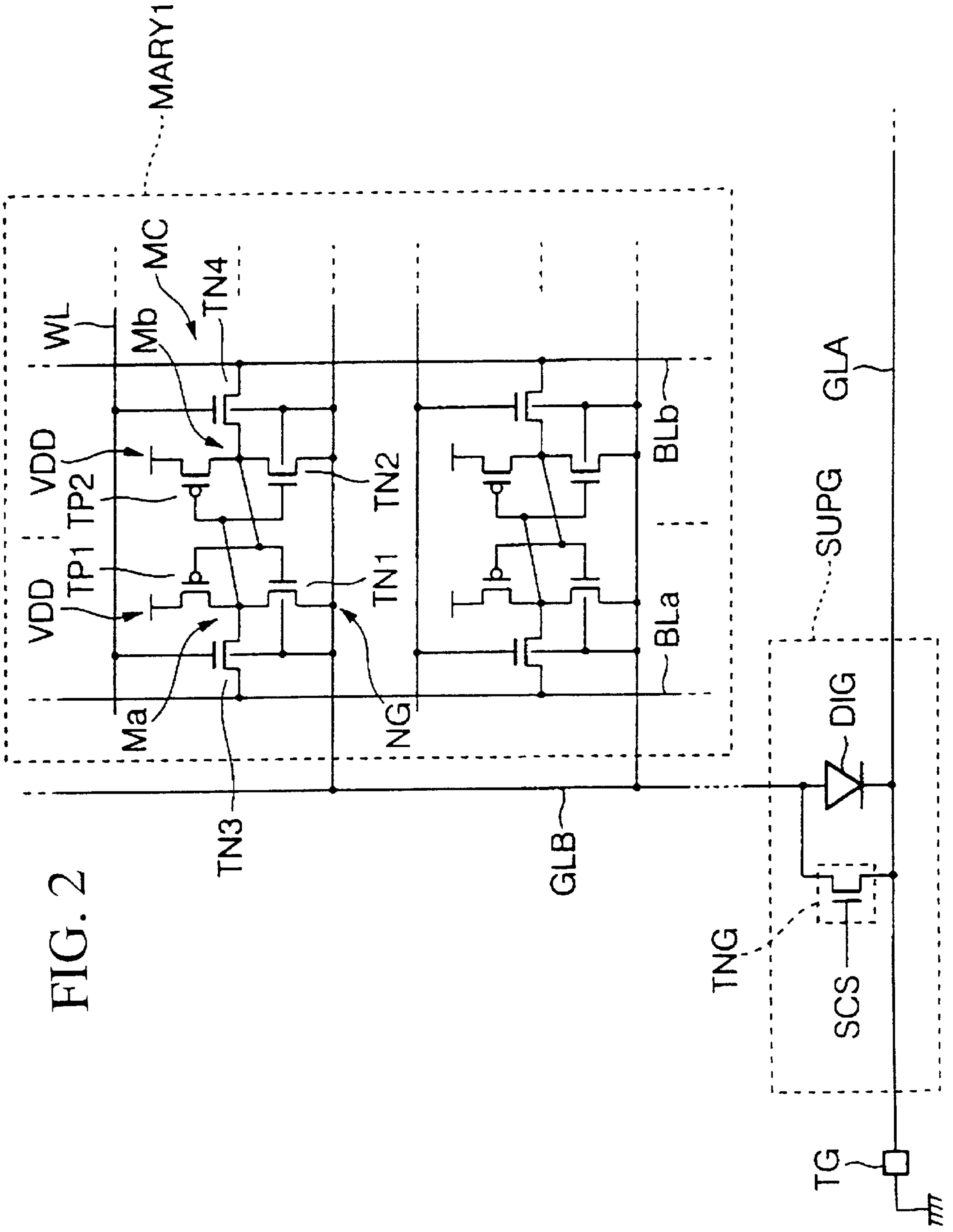
FIG. 2 is a circuit diagram illustrative of a novel circuit configuration of a semiconductor memory device in a first embodiment in accordance with the present invention.

A first embodiment according to the present invention will be described in detail with reference to the drawings FIG. 2 is a circuit diagram illustrative of a novel circuit configuration of a semiconductor memory device in a first embodiment in accordance with the present invention. The semiconductor memory device has a stand-by-mode. The semiconductor memory device includes gate circuits comprising field effect transistors and a current path between the power supply and the ground such as the CMOS inverter.

The semiconductor memory device includes a memory cell array "MARY1" and a low voltage supplying circuit "SUPG" which is electrically connected to the memory cell array "MARY1" for supplying the ground potential to the memory cell array "MARY1". The memory cell array "MARY1" comprises an array in matrix of memory cells "MC", each of which stores 1-bit data. The low voltage supplying circuit "SUPG" supplies a potential of ground nodes "NG" of the memory cells "MC". Each of the memory cells "MC" comprises a flip-flop circuit mainly. The memory cell "MC" includes two p-channel MOS field effect transistors TP1 and TP2 and four n-channel MOS field effect transistors TN1, TN2, TN3 and TN4.

The flip-flop circuit comprises the two p-channel MOS field effect transistors TP1 and TP2 and the two n-channel MOS field effect transistors TN1 and TN2. The flip-flop circuit has memory nodes "Ma" and "Mb" for storing the potentials in the memory cell "MC". The memory nodes "Ma" and "Mb" are connected through the n-channel MOS field effect transistors TN3 and EN4 to paired bit lines "BLa" and "BLb" respectively. The n-channel MOS field effect transistors TN3 and TN4 serve as transfer gates for respective data transfers between the memory nodes "Ma" and "Mb" and the paired bit lines "BLa" and "BLb". Gates of the n-channel MOS field effect transistors TN3 and TN4 are connected to a common word line "WL".

Sources of the p-channel MOS field effect transistors TP1 and TP2 serve as power nodes and are connected to a power supply VDD. Sources of the n-channel MOS field effect transistors TN1 and TN2 serve as ground nodes and are connected to a ground line GLB which is connected to the low voltage supplying circuit "SUPG". Substrates of the n-channel MOS field effect transistors TN1, TN2, TN3 and TN4 are connected through the ground nodes "NG" commonly to the ground line GLB. The substrates of the n-channel MOS field effect transistors TN1, TN2, TN3 and TN4 have the same potential as the sources thereof. Even illustration is omitted in FIG. 2, the paired bit lines "BLa" and "BLb" are connected to a pre-charge circuit for initializing the paired bit lines "BLa" and "BLb" to the power voltage for read operation from the memory cell "MC".

In view of protecting the data in the memory cell "MC" in the read operation, the n-channel MOS field effect transistors TN3 and TN4 serving as the transfer gates are smaller in current driving ability than the n-channel MOS field effect transistors TN1 and TN2, thereby isolating the potential of the pared bit lines "BLa" and "BLb" from the memory cell "MC".

The low voltage supplying circuit "SUPG" has the following structure. The low voltage supplying circuit "SUPG" is provided to supply the potential to the ground nodes "NG" of the memory cell "MC". The low voltage supplying circuit "SUPG" comprises an n-channel MOS field effect transistor "TNG" and a diode "DIG". A gate threshold voltage of the n-channel MOS field effect transistor "TNG" is set so high that the potential of the ground line "GLB" is cramped at a higher potential by a barrier potential Vf of the diode "DIG" from the ground potential.

A drain of the n-channel MOS field effect transistor "TNG" is connected through the ground line "GLB" to the ground nodes "NG" of the memory cell "MC". A source of the n-channel MOS field effect transistor "TNG" is connected to a ground line "GLA" which is further connected to a ground external terminal "TG". This ground external terminal "TG" is fixed at a ground potential 0V. A gate of the n-channel MOS field effect transistor "TNG" is applied with a signal "SCS" which is set low level in the static mode such as the stand-by mode of semiconductor device.

The following descriptions will be made assuming that the static mode is the stand-by mode as one example, even the static mode may optionally be set as the read mode and the write mode, where the operation cycle is long.

An anode of the diode "DIG" is connected through the ground line "GLB" to the ground nodes "NG" of the memory cell "MC". A cathode of the diode "DIG" is connected to the ground line "GLA" which is further connected to the ground external terminal "TC". The n-channel MOS field effect transistor "TNG" and the diode "DIG" are capable of supplying a sufficient current for supplying the ground potential to the memory cell "MC" in the memory cell array "MARY1".

Although the semiconductor memory device has the single memory cell array "MARY1". This memory cell array "MARY1" may optionally be divided into a plurality of blocks, so that a plurality of the low voltage supplying circuits "SUPG" are supplied for the plural blocks respectively.

Operations of the semiconductor memory device will be described. In the active modes such as the read and write modes, the signal "SCS" is fixed at the high level, whereby the n-channel MOS field effect transistor "TNG" is placed in ON-state. The low voltage supplying circuits "SUPG" supplies the predetermined ground potential to the ground nodes "NG" of the memory cell "MC", whereby the round nodes "NG" are fixed at the predetermined ground potential. If the n-channel MOS field effect transistor "TN2" is placed in OFF-state, then the n-channel MOS field effect transistor "TN1" is placed in ON-state. In this case, the predetermined ground potential appears at the memory node "Ma", and the power voltage appears at the memory node "Mb".

The following description will be made assuming that the active mode is the read mode or the write mode. If the n-channel MOS field effect transistor "TN2" is placed in OFF-state. Then the round potential is applied to the source of the n-channel MOS field effect transistor "TN2". The gate of the n-channel MOS field effect transistor "TN2" is applied with the ground potential as the potential of the memory node "Ma". The drain of the n-channel MOS field effect transistor "TN2" is applied with the power voltage VDD a the potential of tic memory node "Mb".

A high electric field is caused in the vicinity of the drain of the n-channel MOS field effect transistor "TN2". This means it possible that the band-to-band leak current is caused. Even if the band-to-band leak current is caused, then this current is so smaller than the charge/discharge currents, for which reason the band-to-hand leak current is not influence to the increase in the current consumption.

In the static mode such as the stand-by mode, the low voltage supplying circuits "SUPG" shifts the predetermined round potential applied to the ground external terminal "TG" so as to reduce the potential difference between the power potential and the ground potential.

In the static mode, the signal "SCS" is set low level, and the n-channel MOS field effect transistor "TNG" is placed in OFF-state. Since the gate threshold voltage of the n-channel MOS field effect transistor "TNG" is set high, then the current from the memory cells "MC" effectively flows into the diode "DIG". The potential of the ground line "GLB" is cramped at a higher potential than the potential of the ground line "GLA" by the harrier potential Vf generated by the p-n junction of the diode "DIG". Consequently, the ground line "GLA" is connected to the ground external terminal "TG" which is fixed at the predetermined ground potential, for which reason the ground line "GLB" is fixed at a higher potential than the predetermined ground potential by the barrier potential Vf, whereby the potential of the ground nodes "NG" of the memory cells "MC" is higher than the predetermined ground potential by the barrier potential Vf.

Since the potential of the ground nodes "NG" of the memory cells "MC" is higher than the predetermined ground potential by the barrier potential Vf, this potential of the ground nodes "NG" is transmitted through the n-channel MOS field effect transistor "TN1" in the ON-state to the memory node "Ma", whereby the potential of the ground nodes "NG" appears at the memory node "Ma". Thus, the gate potential of the n-channel MOS field effect transistor "TN2" in the OFF-state is increased by the harrier potential Vf.

The power potential is transmitted through the p-channel MOS field effect transistor "TP2" to the memory node "Mb". This power potential is constant, for which reason the potential difference between the gate and the drain of the n-channel MOS field effect transistor "TN2" becomes small relatively, which results in the desirable relaxation of the field concentration between the gate and the drain thereof. The relaxation of the field concentration between the gate and the drain of the n-channel MOS field effect transistor "TN2" causes a decreased band-to-band leak current of the n-channel MOS field effect transistor "TN2".

The increase in the potential of the ground nodes "NG" causes the substrate potentials of the n-channel MOS field effect transistors "TN3" and "TN4", resulting in reduction in the band-to-band leak current of the n-channel MOS field effect transistors "TN3" and "TN4".

Further, the n-channel MOS field effect transistor "TNG" is placed in the OFF-state, where the potential difference corresponding to the barrier potential is present between the source and the drain. This means that the n-channel MOS field effect transistor "TNG" is in the bias state which allows the sub-threshold current. The gate threshold voltage of the n-channel MOS field effect transistor "TNG" is, however, set so high as to effectively suppress the sub-threshold current in the n-channel MOS field effect transistor "TNG".

In accordance with the first embodiment, the leakage of current due to the band-to-band tunneling current is effectively suppressed in the n-channel MOS field effect transistor "TN2" placed in the OFF-state in the memory cell "MC". Also, the p-channel MOS field effect transistor "TP1" is placed in the OFF-state and in the bias state which allows the band-to-band leak current. In general, the p-channel MOS field effect transistor is higher in withstand voltage than the n-channel MOS field effect transistor. This means that the p-channel MOS field effect transistor is unlikely to cause the band-to-band leak current. In accordance with this first embodiment, the field concentration between the gate and the drain of the p-channel MOS field effect transistor "TP1", for which reason no band-to-band leak current is caused in the p-channel MOS field effect transistor "TP1".

The ground potential is shifted by utilizing the forward current characteristic of the diode "DIG". When the potential of the around line "GLB" exceeds the barrier potential Vf, then the forward-current is caused of the diode "DIG", whereby the increase in the potential of the ground line "GLB" is suppressed. This may prevent any high impedance state between the ground line "GLB" and the ground, whereby the potential of the ground line "GLB" is kept constant, which results in the desirable and effective suppression to the ground noise on the ground line "GLB". No large variation in potential as the data in the memory cell is caused. Namely, a desirable and stable data storage characteristic can be obtained.

The barrier potential Vf of the diode "DIG" is the physical constant, which is independent from the process variations, on which the resistance value of the polysilicon and the gate threshold voltage of the field effect transistor depend. No variation is caused in the potential of the ground line "GLB", which results in desirable and stable data storage characteristic of the memory cell as well as a constant transition time from the stand-by state to the active state.

It is easy to form the p-n junction over the semiconductor substrate for realizing the diode "DIG" with a small occupied area because of its high forward-current ability. Since the barrier potential Vf of the diode is the physical constant, then any specific voltage generating circuit is unnecessary for causing the barrier potential Vf, resulting in no further consumed current in the voltage generating circuit. No specific voltage generating circuit needs no further occupied area.

The above description has been made in a case that the memory nodes "Ma" and "Mb" store low and high levels respectively. It is also possible as a modification that the memory nodes "Ma" and "Mb" store high and low levels respectively. In this case, the p-channel MOS field effect transistor "TP2" and the n-channel MOS field effect transistor "TN1" are in the OFF-state, whereby the band-to-band leak current in the vicinity of the drain is suppressed effectively. Although in this embodiment, the gate threshold voltage of the n-channel MOS field effect transistor "TNG" in the low voltage supplying circuit "SUPG" is set high. If tech sub-threshold current is unlikely to be caused, it is not necessarily to set the gate threshold voltage so high.

Second Embodiment

Figure 3:
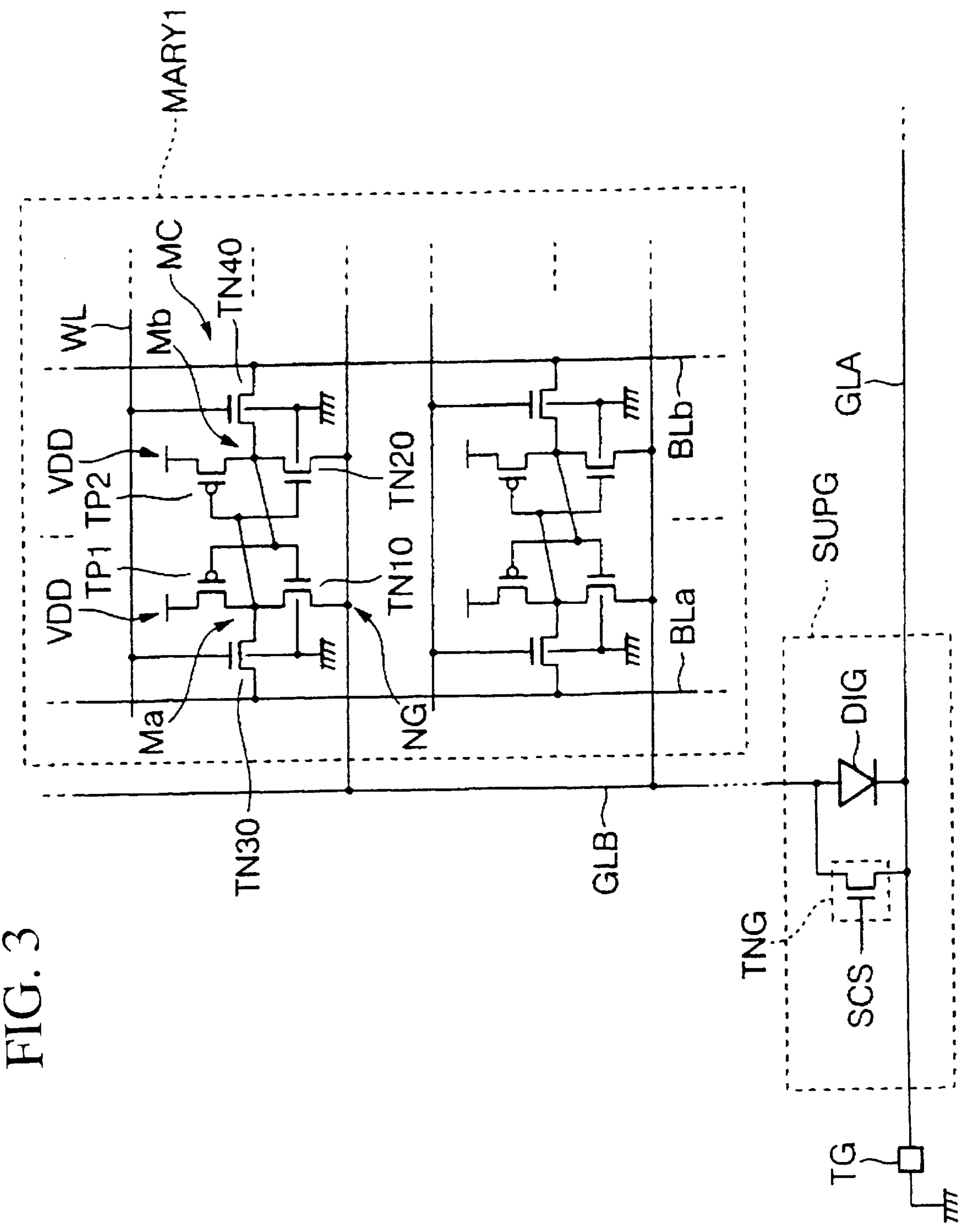
FIG. 3 is a circuit diagram illustrative of a novel circuit configuration of a semiconductor memory device in a second embodiment in accordance with the present invention.

A second embodiment according to the present invention will be described in detail with reference to the drawings. FIG. 3 is a circuit diagram illustrative of a novel circuit configuration of a semiconductor memory device in a second embodiment in accordance with the present invention. The semiconductor memory device includes a memory cell array "MARY1" and a low voltage supplying circuit "SUPG" which is electrically connected to the memory cell array "MARY1" for supplying the ground potential to the memory cell array "MARY1".

The circuit configuration of the semiconductor memory device of this embodiment is identical with the first embodiment except for the followings. In place of the n-channel MOS field effect transistors "TN1", "TN2", "TN3" and "TN4" in the memory cell "MC", other n-channel MOS field effect transistors "TN10", "TN20", "TN30" and "TN40" are provided in the memory cell "MC", wherein the substances thereof are grounded at a ground voltage 0V.

The flip-flop circuit comprises the p-channel MOS field effect transistors "TP1" and "TP2" and the n-channel MOS field effect transistors "TN10" and "TN20". In the memory cell "MC", memory nodes "Ma" and "Mb" are connected through the n-channel MOS field effect transistors "TN30" and "TN40" to the paired bit lines "BLa" and "BLb". The n-channel MOS field effect transistors "TN30" and "TN40" serve as transfer gates for data transfers between the memory node, "Ma" and "Mb" and the paired bit lines "BLa" and "BLb", respectively. Gates of the n-channel MOS field effect transistors "TN30" and "TN40" are connected to the common word line "WL". Other circuit configuration is the same as in the first embodiment.

Operations of the semiconductor memory device of this embodiment will subsequently be described. In the active mode such as the read and write modes, the signal "SCS" is fixed at high level, and the low voltage supplying circuit "SUPG" supplies the predetermined ground potential to the memory cell "MC", so that the ground nodes "NG" in the memory cell "MC" are fixed at the predetermined ground potential. The memory cell "MC" is supplied with the predetermined power voltage and ground voltage for allowing the operations in the read or write mode.

In the static mode such as the stand-by mode, the potential of the ground line "GLB" is shifted up to a higher potential than the potential of the ground line "GLA" by the barrier potential Vf of the diode "DIG", so as to increase the potential of the ground nodes "NG" by the barrier potential Vf. Since the substrate potential of the n-channel MOS field effect transistors "TN10", "TN20", "TN30" and "TN40" is fixed at the predetermined ground potential, the potential of the sources of those transistors "TN10", "TN20", "TN30" and "TN40" is higher than the substrate potential or the ground potential by the barrier potential Vf.

The gate threshold voltage of the n-channel MOS field effect transistors "TN10", "TN20", "TN30" and "TN40" is increased, which results in effective suppression to the sub-threshold current. In the stand-by mode, all of the word lines are fixed at the low level or the ground level, further suppression to the sub-threshold current can be obtained for the transfer gate transistors, for example, the n-channel MOS field effect transistors "TN30" and "TN40" with the gates connected to the word line.

The substrate potential is different between the above first embodiment and this second embodiment. This substrate potential may optionally be set in the viewpoint of suppression to the band-to-band leak current or the sub-threshold current. It may be effective to set the substrate potential so as to suppress more influential one of the band-to-band leak current and the sub-threshold current for the purpose of suppressing the consumed current. The selection of the band-to-band leak current or the sub-threshold current as the suppression target may depend on the specification of the product or the process technique.

Third Embodiment

Figure 4:
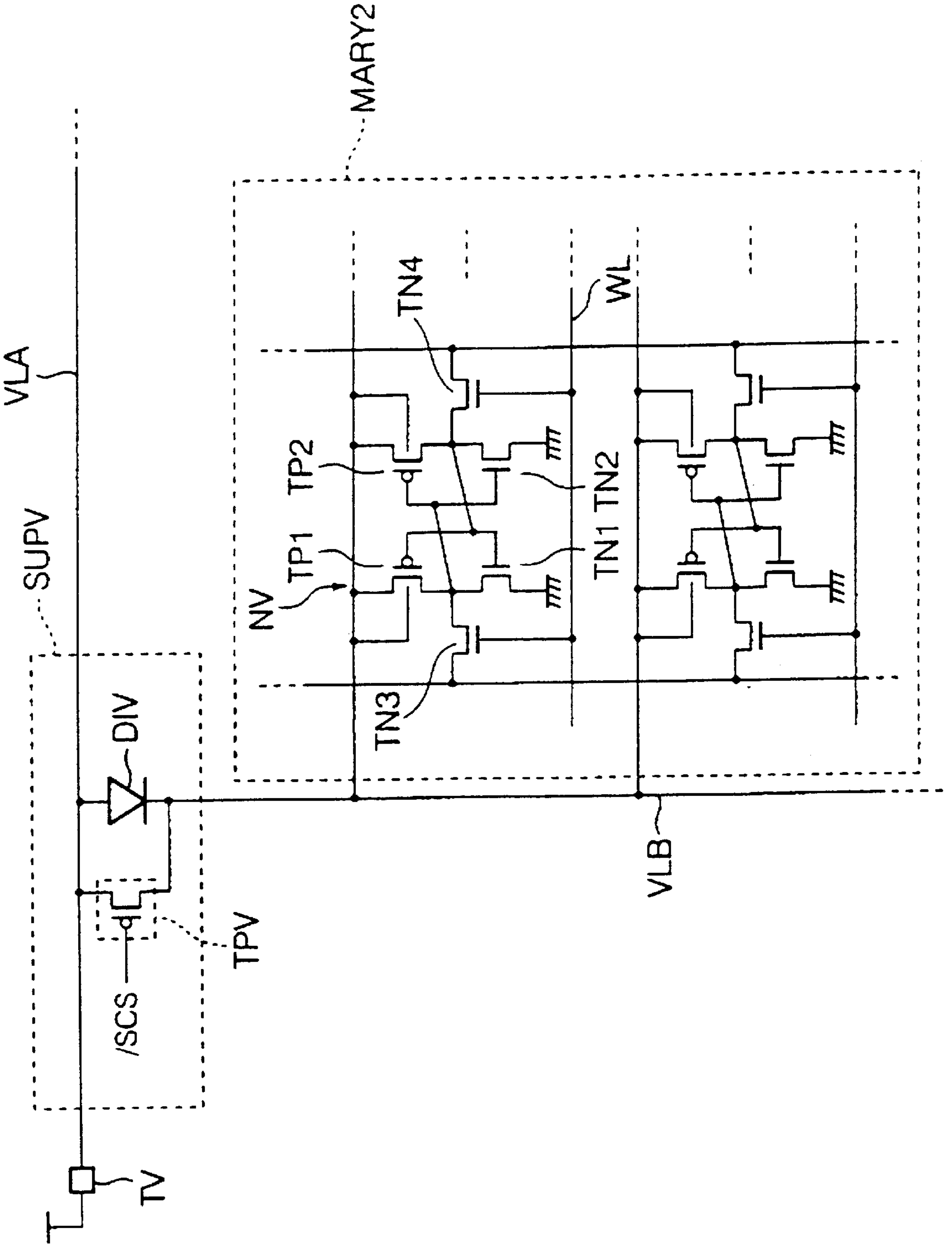
FIG. 4 is a circuit diagram illustrative of a novel circuit configuration of a semiconductor memory device in a third embodiment in accordance with the present invention.

A third embodiment according to the present invention will be described in detail with reference to the drawings. FIG. 4 is a circuit diagram illustrative of a novel circuit configuration of a semiconductor memory device in a third embodiment in accordance with the present invention. The semiconductor memory device includes a memory cell array "MARY2" and a high voltage supplying circuit "SUPV" which is electrically connected to the memory cell array "MARY1" for supplying the power voltage to power nodes "NV" in each of the memory cells "MC" of the memory cell array "MARY2".

The memory cell array "MARY2" of this embodiment is identical with the memory cell array "MARY1" of the above first embodiment except that the high voltage supplying circuit "SUPV" supplies the potential to the power nodes "NV" of the memory cell "MC". The power nodes "NV" of the memory cell "MC" are connected to the power line "VLB" which is further connected to the high voltage supplying circuit "SUPV". The ground nodes "NG" of the memory cell "MC" are grounded and fixed at the predetermined ground potential 0V.

The high voltage supplying circuit "SUPV" comprises a p-channel MOS field effect transistor "TPV" and a diode "DIV". A gate threshold voltage of the p-channel MOS field effect transistor "TPV" is set so high that the potential of the ground line "GLA" is cramped at a lower potential by a barrier potential Vf of the diode "DIG" from the power potential.

A drain of the p-channel MOS field effect transistor "TPV" is connected through the ground line "VLB" to the power nodes "NV" of the memory cell "MC". A source of the p-channel MOS field effect transistor "TPV" is connected to a ground line "VLA" which is further connected through a power terminal "TV" to the power supply. A gate of the p-channel MOS field effect transistor "TPV" is applied with a signal "SCS" which is set high level in the static mode such as the stand-by mode of the semiconductor device.

A cathode of the diode "DIV" is connected through the power line "VLB" to the power nodes "NV" of the memory cell "MC". An anode of the diode "DIV" is connected through the power line "VLA" to the power terminal "TV" fixed at the predetermined power potential. The p-channel MOS field effect transistor "TPV" and the diode "DIV" are capable of supplying a sufficient current for supplying the power potential to the memory cell "MC" in the memory cell array "MARY2".

Other circuit configurations are the same as the first embodiment.

Operations of the semiconductor memory device of this embodiment will subsequently be described. In the active mode such as the read and write modes, the signal "/SCS" is fixed at low level, whereby the p-channel MOS field effect transistor "TPV" is placed in the ON-state. The high voltage supplying circuit "SUPV" supplies the predetermined power potential to the memory cell "MC", so that the power nodes "NV" in the memory cell "MC" are fixed at the predetermined power potential. If the memory nods "Ma" stores the low level, whilst the memory node "Mb" stores the high level, then the high level stored at the memory node "Mb" is the predetermined power potential. Similarly to the above first embodiment, the memory cell "MC" is supplied with the power potential and the ground potential for allowing the semiconductor memory device to store the data.

In the static mode such as the stand-by mode, the signal "/SCS" is fixed at high level, whereby the p-channel MOS field effect transistor "TPV" is placed in the OFF-state. The potential of the power line "VLB" is cramped at a lower potential than the potential of the power line "VLA" by the barrier potential Vf of the diode "DIG", so as to decrease the potential of the power nodes "NV" by the barrier potential Vf. This decrease in the potential of the power nodes "NV" by the barrier potential Vf causes that the potential of the drain of the n-channel MOS field effect transistor "TN2" in the OFF-state is decreased by the barrier potential Vf, wherein the gate of the n-channel MOS field effect transistor "TN2" is supplied with the ground potential which is transmitted through the n-channel MOS field effect transistor "TN1". As compared to the active mode, the potential difference between the gate and the drain of the n-channel MOS field effect transistor "TN2" is decreased by the barrier potential Vf, whereby the field concentration in the vicinity of the drain is relaxed.

In accordance with this third embodiment, the suppression may be obtained to the band-to-band leak current in the vicinity of the drains of the n-channel MOS field effect transistors "TN1" and "TN2" and the p-channel MOS field effect transistors "TP1" and "TP2", which results in the effective reduction in the current leakage due to the band-to-band tunneling current.

Further, this, third embodiment is not so effective to suppress the band-to-band leak current of the transfer gate transistors, for example, the n-channel MOS field effect transistors "TN3" and "TN4". Since the sources of the driver transistors, for example, the n-channel MOS field effect transistors "TN1" and "TN2" are grounded directly, no excess resistance is caused between the sources of those driver transistors and the ground. The current driving ability of the memory cell is not deteriorated, and any deterioration in the high speed performance in the read/write operations is not caused.

In this third embodiment, the substrate potential of the p-channel MOS field effect transistors "TP1" and "TP2" is set identical with the source potential thereof. It is, however, possible as a modification that the substrate potential of the p-channel MOS field effect transistors "TP1" and "TP2" is set at the predetermined power potential in the viewpoint of suppression to the sub-threshold currents of the p-channel MOS field effect transistors "TP1" and "TP2" and the n-channel MOS field effect transistors "TN1" and "TN2". It may be effective to set the substrate potential so as to suppress more influential one of the band-to-band leak current and the sub-threshold current for the purpose of suppressing the consumed current. The selection of the band-to-band leak current or the sub-threshold current as the suppression target may depend on the specification of the product or the process technique.

Fourth Embodiment

Figure 5:
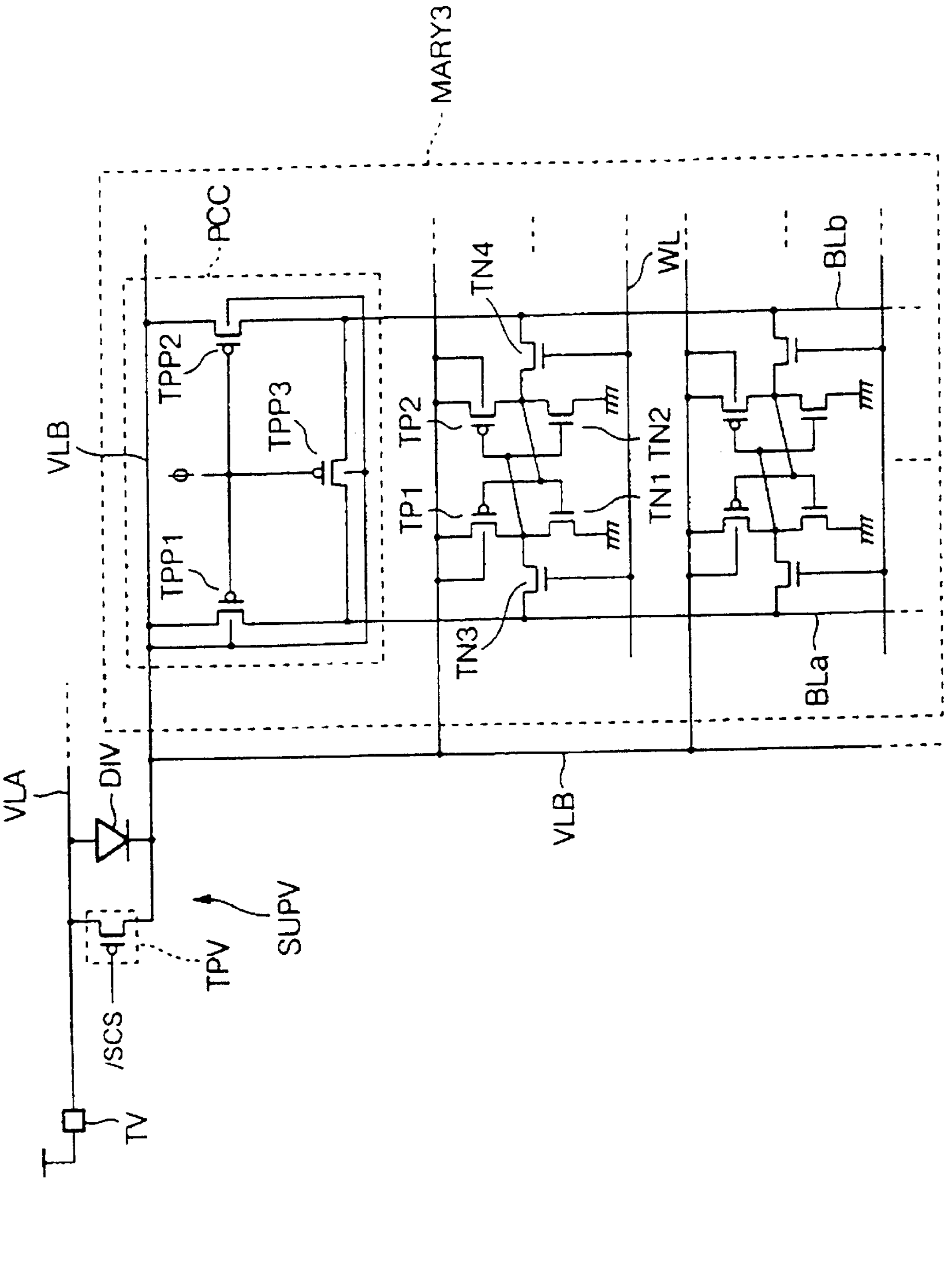
FIG. 5 is a circuit diagram illustrative of a novel circuit configuration of a semiconductor memory device in a fourth embodiment in accordance with the present invention.

A fourth embodiment according to the present invention will be described in detail with reference to the drawings. FIG. 5 is a circuit diagram illustrative of a novel circuit configuration of a semiconductor memory device in a fourth embodiment in accordance with the present invention. The semiconductor memory device includes a memory cell array "MARY3" and a high voltage supplying circuit "SUPV" which is electrically connected to the memory cell array "MARY3" for supplying the power voltage to not only power nodes "NV" in each of the memory cells "MC" but also a pre-change circuit "PCC" in the memory cell array "MARY3".

The pre-change circuit "PCC" comprises p-channel MOS field effect transistors "TPP1", "TPP2" and "TPP3". Sources of the p-channel MOS field effect transistors "TPP1" and "TPP2" are commonly connected to the power line "VLB". Drains of the p-channel MOS field effect transistors "TPP1" and "TPP2" are connected to paired bit lines, "BLa" and "BLb" respectively. A current path of the p-channel MOS field effect transistor "TPP3" is connected between the paired bit lines "BLa" and "BLb". Gates of the p-channel MOS field effect transistors "TPP3", "TPP2" and "TPP3" are supplied with a common pro-charge signal ϕ. The substrates of the p-channel MOS field effect transistors "TPP1", "TPP2" and "TPP3" are commonly connected to the power line "VLB".

If the pre-charge signal ϕ is low level, then the p-channel MOS field effect transistor "TPP1" equalizes the paired bit lines "BLa" and "BLb". The paired bit lines "BLa" and "BLb" are pre-charged at the potential of the power line "VLB" by the p-channel MOS field effect transistors "TPP1" and "TPP2" In the static mode the pre-charge signal ϕ is fixed at low level, and the paired bit lines "BLa" and "BLb" are fixed at the pre-charged potential level.

Operations of the semiconductor memory device of this embodiment will subsequently be described. In the active mode such as the read and write modes, the signal "/SCS" is fixed at low level, whereby the p-channel MOS field effect transistor "TPV" is placed in the ON-state. The high voltage supplying circuit "SUPV" supplies the predetermined power potential to the memory cell "MC", so that the power nodes "NV" in the memory cell "MC" are fixed at the predetermined power potential. If the memory node "Ma" stores the low level, whilst the memory node "Mb" stores the high level, then the high level stored at the memory node "Mb" is the predetermined power potential. Similarly to the above first embodiment, the memory cell "MC" is supplied with the power potential and the ground potential for allowing the semiconductor memory device to store the data.

In the static mode such as the stand-by mode, the signal "/SCS" is fixed at high level, whereby the p-channel MOS field effect transistor "TPV" is placed in the OFF-state. The potential of the power line "VLB" is cramped at a lower potential than the potential of the power line "VLA" by the barrier potential Vf of the diode "DIG", so as to decrease the potential of the power nodes "NV" by the barrier potential Vf as well as decrease the power potential to the pre-charge circuit "PCC" by the barrier potential Vf. In this static mode, the paired bit lines "BLa" and "BLb" are cramped at a lower potential than the predetermined power potential by the barrier potential Vf of the diode "DIG".

The transfer gates, for example, the n-channel MOS field effect transistors "TN3" and "TN4" are in the bias state. If the memory node "Ma" stores the low level, whilst the memory node "Mb" stores the high level, one of the source and drain of the n-channel MOS field effect transistor "TN3" is biased at a lower potential by the barrier potential Vf than the predetermined power potential, and another is biased at a predetermined ground potential. The source and the drain of the n-channel MOS field effect transistor "TN4" are biased at the lower potential than the predetermined power potential by the barrier potential Vf.

In the n-channel MOS field effect transistor "TN3" and "TN4", the field intensity between the source and drain is relaxed. In accordance with this fourth embodiment, the suppression can be obtained to the band-to-band leak currents of the transfer gates, for example, the n-channel MOS field effect transistors "TN3" and "TN4". A further reduction in consumed current in the static mode can be obtained.

Fifth Embodiment

Figure 6A:
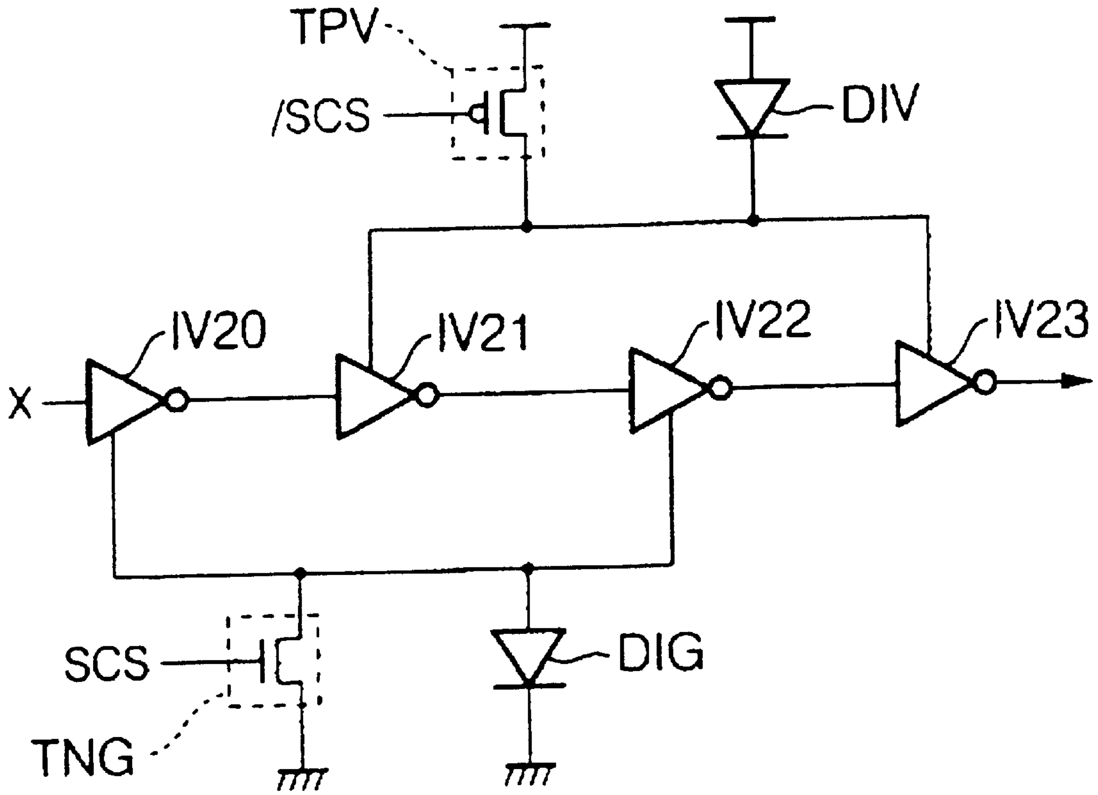
FIG. 6A is a circuit diagram illustrative of a novel circuit configuration of an inverter chain in a fifth embodiment in accordance with the present invention.

A fifth embodiment according to the present invention will be described in detail with reference to the drawings. FIG. 6A is a circuit diagram illustrative of a novel circuit configuration of an inverter chain in a fifth embodiment in accordance with the present invention. A primary object of this fifth embodiment is to suppress the sub-threshold current rather than suppression to the band-to-band leak current.

The inverter chain includes a series connection of four inverters "IV20", "IV21", "IV22" and "IV23", and diodes "DIG" and "DIV", an n-channel MOS field effect transistor "TNG" and a p-channel MOS field effect transistor "TPV". The diode "DIG" is identical with the diode "DIG" in the first embodiment. The diode "DIV" is identical with the diode "DIV" in the third embodiment. The p-channel MOS field effect transistors "TPV" is identical with the p-channel MOS field effect transistors "TPV" in the first embodiment.

The gate threshold voltage of the n-channel MOS field effect transistor "TNG" is set so high that the potential of the ground nodes is cramped at a higher potential than the predetermined ground potential by the harrier potential Vf of the diode "DIG". The gate threshold voltage of the p-channel MOS field effect transistor "TPV" is set so high that the potential of the power nodes is cramped at a lower potential than the predetermined power potential by the barrier potential Vf of the diode "DIG".

Each of the inverters "IV20", "IV21", "IV22" and "IV23" has a CMOS. The inverter "IV20" on the first stage receives a signal "X" which is in the low level in the static mode. Ground nodes of the inverters "IV20" and "IV22" are connected to the drain of the n-channel MOS field effect transistor "TNG" and the anode of the diode "DIG". The power nodes of the inverters "IV21" and "IV23" are connected to the drain of the p-channel MOS field effect transistor "TPV" and the cathode of the diode "DIV".

In each of the inverters "IV20", "IV21", "IV22" and "IV23", the substrates of the p-channel MOS field effect transistors are fixed at the predetermined power potential, whilst the substrates of the n-channel MOS field effect transistors are fixed at the predetermined and potential.

Operations of the inverter chain of FIG. 6A will be described. In the active mode, the signal "/SCS" is fixed at a low level, whilst the signal "SCS" is fixed at a high level. The ground nodes of the inverters "IV20" and "IV22" are supplied with the ground potential from the p-channel MOS field effect transistor "TPV", whereby the inverter chain comprising the series connection of the inverters "IV20", "IV21", "IV22" and "IV23" operates in response to the signal X.

In the static mode, the signal "/SCS" is fixed at the high level or the predetermined power potential, whilst the signal "SCS" is fixed at the low level. The p-channel MOS field effect transistor "TPV" and the n-channel MOS field effect transistor "TNG" are placed in OFF-state. The potential of the ground nodes of the inverters "IV20" and "IV22" is fixed at a higher potential than the predetermined ground potential by the barrier potential Vf of the diode "DIG?. The potential of the power nodes of the inverters "IV21" and "IV23" is fixed at a lower potential than the predetermined power potential by the barrier potential Vf of the diode "DIV".

In the static mode, the signal "X" is fixed at the low level. In the inverter "IV20", the p-channel MOS field effect transistors are placed in the ON-state, and the n-channel MOS field effect transistors are placed in the OFF-state, whereby the inverter "IV20" outputs high level. In this case, the source of the n-channel MOS field effect transistor in the OFF-state is supplied with a higher potential than the ground potential by the barrier potential Vf. The substrate of the n-channel MOS field effect transistor is fixed at the ground potential. The substrate potential of the n-channel MOS field effect transistor is lower than the source potential.

The gate threshold voltages of the n-channel MOS field effect transistors in the inverter "IV20" are increased, which results in suppression to the sub-threshold voltage. The inverter "IV22" shows the same operation as described above with reference to the inverter "IV20". In each of the inverters, the substrate potentials of the p-channel MOS field effect transistors are fixed at the power potential, whilst the substrate potentials of the n-channel MOS field effect transistors are fixed at the ground potential.

It is, however, possible as a modification that in each of the inverters, the substrates of the p-channel MOS field effect transistors are connected to the sources thereof, whilst the substrates of the n-channel MOS field effect transistors are connected to the sources thereof, for the purpose of effective counter-measure to suppress the band-to-band leak current.

In the inverter "IV21" on the next stage to the first stage inverter "IV20", the p-channel MOS field effect transistors are placed in the OFF-state, whilst the n-channel MOS field effect transistors are placed in the ON-state. The inverter "IV21" outputs the low level at the ground potential The gate potential of the p-channel MOS field effect transistors in the OFF-state is higher than the source potential, which results in suppression to the sub-threshold current of the p-channel MOS field effect transistors in the OFF-state. The inverter "IV23" shows the same operation as described above with reference to the inverter "IV21".

Sixth Embodiment

Figure 6B:
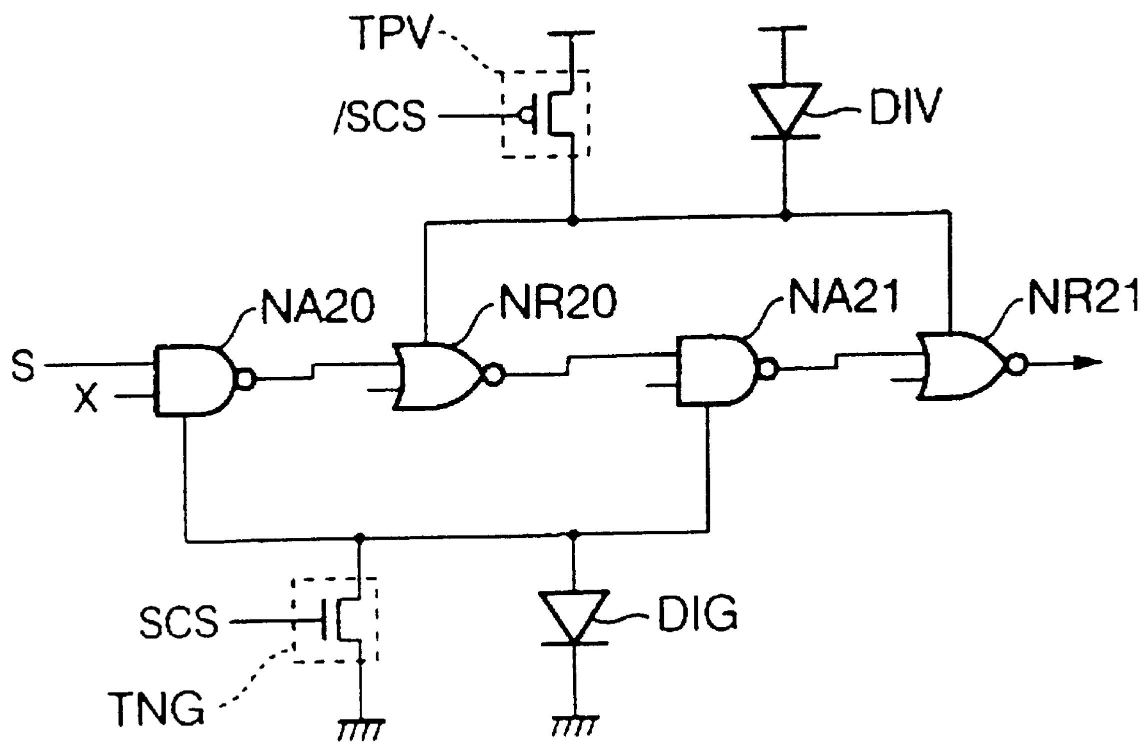
FIG. 6B is a circuit diagram illustrative of a novel circuit configuration of a gate circuit in a sixth embodiment in accordance with the present invention.

A sixth embodiment according to the present invention will be described in detail with reference to the drawings. FIG. 6B is a circuit diagram illustrative, of a novel circuit configuration of a gate circuit in a sixth embodiment in accordance with the present invention. A primary object of this sixth embodiment is to suppress the sub-threshold current rather than suppression to the band-to-band leak current.

The gate circuit includes a series connection of two NAND-gates "NA20" and "NA21" and two NOR-gates "NR20" and "NR21", and diodes "DIG" and "DIV", an n-channel MOS field effect transistor "TNG" and a p-channel MOS field effect transistor "TPV". The diode "DIG" is identical with the diode "DIG" in the first embodiment. The diode "DIV" is identical with the diode "DIV" in the third embodiment. The p-channel MOS field effect transistors "TPV" is identical with the p-channel MOS field effect transistors "TPV" in the first embodiment.

A signal "S" and a signal "X" are inputted into the first stage gate circuit, for example, the NAND-gate "NA20", wherein the gate circuit operation depends on the signal "S" but independent from the signal "X".

Each of the NAND-gates "NA20" and "NA21" includes CMOS. Each of the NOR-gates "NR20" and "NR21" also includes CMOS. A first input of the NAND-gate "NA20" on the first stage receives the signal "S" which is low level in the static mode. A second input of the NAND-gate "NA20" on the first stage receives the signal "X" which is effective in the active mode.

An output from the NAND-gate "NA20" on the first stags is supplied to a first input of the NOR-gate "NR20" on the second stage. An output from the NOR-gate "NR20" on the second stage is supplied to a first input of the NAND-gate "NA21" on the third stage. An output from the NAND-gate "NA21" on the third stage is supplied to a first input of the NOR-gate "NR21" on the final stage.

Second inputs of the NOR-gate "NR20" on the second stage, the NAND-gate "NA21" on the third stage and the NOR-gate "NR21" on the final stage receive respective signals which are effective in the active mode similarly to the signal "X".

The ground nodes of the NAND-gates "NA20" and "NA21" are connected to the drain of the n-channel MOS field effect transistor "TNG" and the anode of the diode "DIG". The power nodes of the NOR-gates "NR20" and "NR21" are connected to the drain of the p-channel MOS field effect transistor "TPV" and the anode of the diode "DIV".

Operations of the gate circuit of FIG. 6B will be described. In the static mode, the signal "S" is fixed at a low level. Independent from the logical value of the signal "X", the NAND-gate "NA20" outputs the high level. The NOR-gate "NR20" receives the high level from the NAND-gate "NA20", so that the NOR-gate "NR20" outputs the low level. The NAND-gate "NA21" receives the low level from the NOR-gate "NR20", so that the NAND-gate "NA21" outputs the high level. The NOR-gate "NR21" receives the high level from the NAND-gate "NA21", so that the NOR-gate "NR21" outputs the low level.

Consequently, if the signal "S" is fixed at the low level, the state of the circuit is fixed independent from the other signals. The state of the gate circuit is independent from the conductive states of the n-channel MOS field effect transistor "TNG" and the p-channel MOS field effect transistor "TPV".

Since in the static mode, the signal; "/SCS" is fixed at the high level, whilst the signal "SCS" is fixed at the low level. The n-channel MOS field effect transistor "TNG" and the p-channel MOS field effect transistor "TPV" are placed in OFF-state. The potential of the ground nodes of the NAND-gates "NA20" and "NA21" are fixed at a higher potential than the predetermined ground potential by the barrier potential "Vf" of the diode "DIG", whilst the potential of the power nodes of the NOR-gates "NR21" and "NR21" are fixed at a lower potential than the predetermined power potential by the barrier potential "Vf" of the diode "DIV", which results in suppression to the sub-threshold currents of the MOS field effective transistors in the OFF-state.

The gate threshold voltages of the p-channel MOS field effect transistor "TPV" and the n-channel MOS field effect transistor "TNG" are set so as to cause effective application of the currents to the diodes "DIG" and "DIV", whereby the power nodes and the ground nodes are shifted by the barrier potential "Vf" of the diodes "DIG" and "DIV".

Seventh Embodiment

Figure 7A:
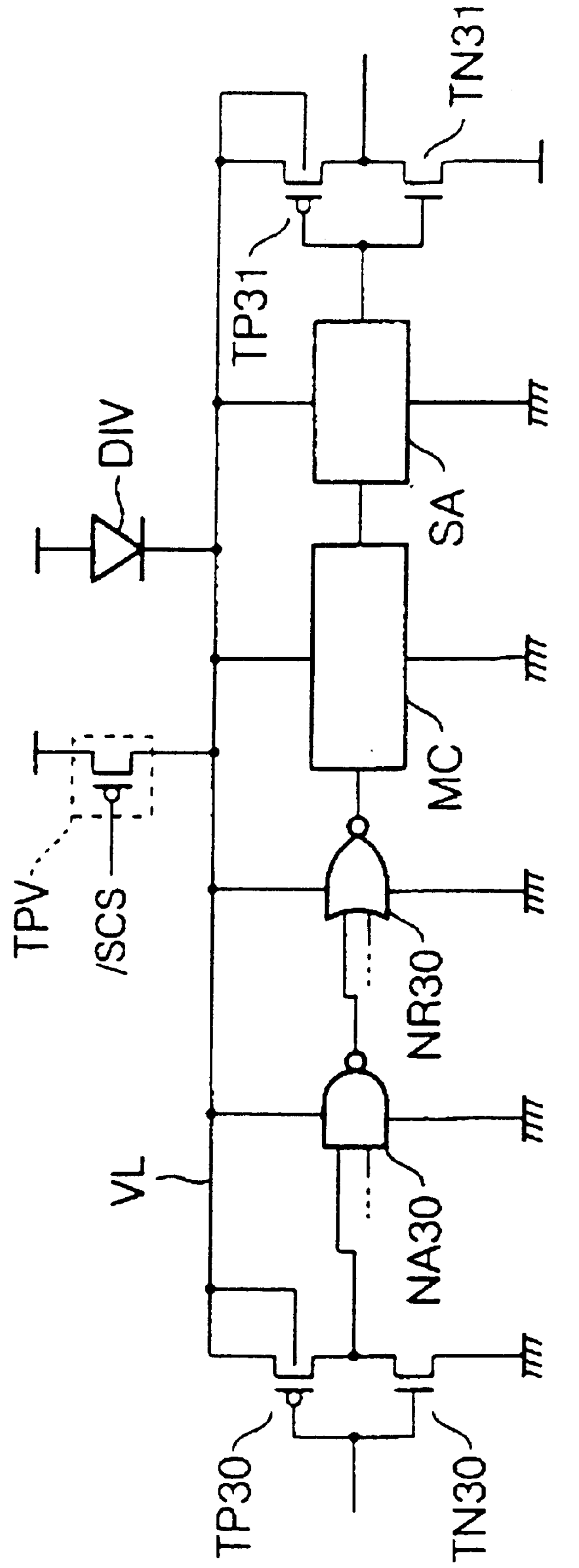
FIG. 7A is a circuit diagram illustrative of a novel circuit configuration of a logic circuit including memory cell and sense amplifier in a seventh embodiment in accordance with the present invention.

A seventh embodiment according to the present invention will be described in detail with reference to the drawings. FIG. 7A is a circuit diagram illustrative of a novel circuit configuration of a logic circuit including memory cell and sense amplifier in a seventh embodiment in accordance with the present invention. A primary object of this seventh embodiment is to suppress the band-to-band leak current of the p-channel MOS field effect transistors in the circuit in whole.

The circuit includes a p-channel MOS field effect transistor "TPV", a diode "DIV", an input stage inverter comprising a prior of a p-channel MOS field effect transistor "TP30" and an n-channel MOS field effect transistor "TN30" all NAND-gate "NA30", an NOR-gate "NR30", a memory cell "MC", a sense amplifier "SA" and an output stage buffer comprising another prior of a p-channel MOS field effect transistor "TP31" and an n-channel MOS field effect transistor "TN3".

The NAND-gate "NA30" and the NOR-gate "NR30" may correspond to a part of a pre-decoder and a main decoder. The memory cell "MC" is selected by the NOR-gate "NR30" for storing input data. The sense amplifier "SA" amplifiers the data signal outputted from the memory cell "MC". The amplified data signal is transmitted to the output stage buffer. Power nodes of the circuit are connected to a power line "VL" which is supplied with a potential from the p-channel MOS field effect transistor "TPV" and the diode "DIV". The source and the substrate of the p-channel MOS field effect transistor "TPV" are connected to the power line "VL".

In the static mode, the potentials of all of the power nodes in the circuit in whole are uniformly dropped by the barrier potential "Vf" of that diode "DIV" which results in small amplitudes of the integral signals. The field concentrations in the vicinity of the drains of the p-channel and n-channel MOS field effect transistors are relaxed, and the band-to-band leak current is suppressed.

In accordance with this seventh embodiment, the power potential supplied to the circuit is uniformly shifted to uniformly relax the field applied to the gate oxide film of the field effect transistors, which results in suppression to the tunnel current through the gate oxide film in addition to the above suppression to the band-to-band leak current.

Except for the input stage inverter comprising the p-channel and n-channel MOS field effect transistors "TP30" and "TN30", the suppressions are made to the tunneling currents through the gate oxide film of the field effect transistors included in the NAND-gate "NA30", the NOR-gate "NR30", the memory cell "MC" and the sense amplifier "SA".

If the high level input signal is inputted into the input stage, then the voltage corresponding to the external signal level is directly applied to the source and the gate of the n-channel AMOS field effect transistor "TN30", for which reason a high field is applied to the gate oxide film of the n-channel MOS field effect transistor "TN30". As a result, the tunneling current flows through the gate oxide film. The amplitude of the input signal to the NAND-gate "NA30" is reduced by the barrier potential Vf of the diode "DIV". The fields applied to the gate oxide films of the field affect transistors in the NAND-gale "NA30" are relaxed, which results in the reduction in the tunneling current flowing through the gate oxide films of the field effect transistors in the NAND-gate "NA30". The amplitude of the input signal to the NOR-gate "NR30" is reduced by the barrier potential Vf of the diode "DIV". The fields applied to the gate oxide films of the field effect transistors in the NOR-gate "NR30" are relaxed, which results in the reduction in the tunneling current flowing through the gate oxide films of the field effect transistors in the NOR-gate NR30".

In this embodiment, the potentials of the power nodes are uniformly shifted to suppress the band-to-band leak current. It is also possible to optionally set the substrate potentials of the field effect transistors in each circuit block, for suppressing both the band-to-band leak current and the sub-threshold current.

In each circuit block, the field effect transistors are selected for the required circuit function, wherein parameters of the transistors are optimized, for which reason the counter-measures to leakage of the currents may be different in the respective circuit blocks. For examples, in the memory cell, the gate threshold voltage of the field effect transistor is set so high as to ensure data holding characteristics with a high priority, which results in the effective suppression to the sub-threshold leak current. If the present invention is applied to the memory cell, it might be preferable to select the circuit configuration suitable for suppressing the band-to-band leak current.

In the peripheral logic circuit region, the gate threshold voltages of the field effect transistors are set so low as to ensure the high speed performance with a high priority. If the present invention is applied to the peripheral logic circuit region, then the circuit configuration suitable for suppressing the sub-threshold current may be preferable.

Eighth Embodiment

Figure 7B:
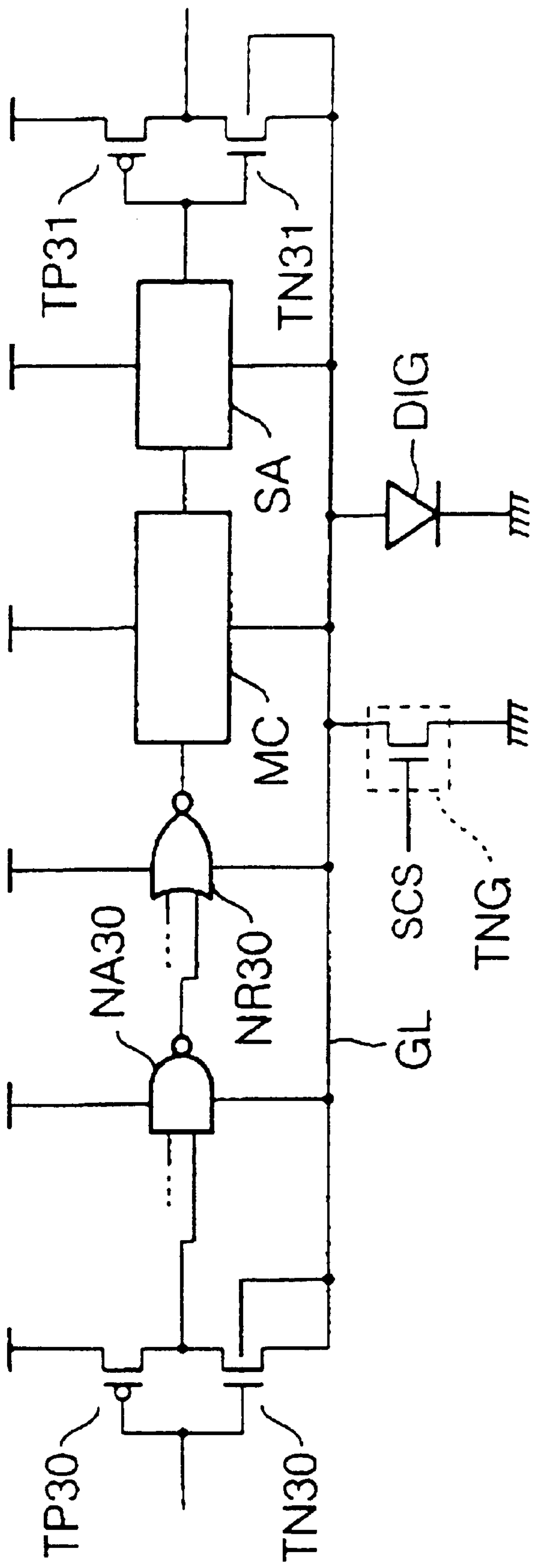
FIG. 7B is a circuit diagram illustrative of a novel circuit configuration of a logic circuit including memory cell and sense amplifier in an eighth embodiment in accordance with the present invention.

An eighth embodiment according to the present invention will be described in detail with reference to the drawings. FIG. 7B is a circuit diagram illustrative of a novel circuit configuration of a logic circuit including memory cell and sense amplifier in an eighth embodiment in accordance with the present invention. A primary object of this eighth embodiment is to suppress the band-to-band leak current of the n-channel MOS field effect transistors in the circuit in whole.

The circuit includes an n-channel MOS field effect transistor "TNG", a diode "DIG", an input stage inverter comprising a prior of a p-channel MOS field effect transistor "TP30" and an n-channel MOS field effect transistor "TN30", an NAND-gate "NA30", an NOR-gate "NR30", a memory cell "MC", a sense amplifier "SA" and an output stage buffer comprising another prior of a p-channel MOS field effect transistor "TP31" and an n-channel MOS field effect transistor "TN31".

The NAND-gate "NA30" and the NOR-gate "NR30" may correspond to a part of a pre-decoder and a main decoder. The memory cell "MC" is selected by the NOR-gate "NR30" for storing input data. The sense amplifier "SA" amplifiers the data signal outputted from the memory cell "MC". The amplified data signal is transmitted to the output stage buffer. Ground nodes of the circuit are connected to a ground line "GL" which is supplied with a potential from the n-channel MOS field effect transistor "TNG" and the diode "DIG". The source and the substrate of the n-channel MOS field effect transistor "TNG" are connected to the ground line "GL".

In the static mode the potentials of all of the power nodes in the circuit in whole are uniformly increased by the barrier potential "Vf" of the diode "DIG", which results in small amplitudes of the internal signals. The field concentrations in the vicinity of the drains of the p-channel and n-channel MOS field effect transistors are relaxed, and the hand-to-band leak current is suppressed.

In accordance with this eighth embodiment, the power potential supplied to the circuit is uniformly shifted to uniformly relax the field applied to the gate oxide film of the field effect transistors, which results in suppression to the tunnel current through the gate oxide film in addition to the above suppression to the band-to-band leak current.

Except for the input stage inverter comprising the p-channel and n-channel MOS field effect transistors "TP30" and "TN30", the suppressions are made to the tunneling currents through the gate oxide film of the field effect transistors included in the NAND-gate "NA30", the NOR-gate "NR30", the memory cell "MC" and the sense amplifier "SA".

If the low level input signal is inputted into the input stage, then the voltage corresponding to the external signal level is directly applied to the source and the gate of the p-channel MOS field effect transistor "TP30", for which reason a high field is applied to the gate oxide film of the p-channel MOS field effect transistor "TP30". As a result, the tunneling current flows through the gate oxide film. The amplitude of the input signal to the NAND-gate "NA30" is reduced by the barrier potential Vf of the diode "DIG". The fields applied to the gate oxide films of the field effect transistors in the NAND-gate "NA30" are relaxed, which results in the reduction in the tunneling current flowing through the gate oxide films of the field effect transistors in the NAND-gate "NA30". The amplitude of the input signal to the NOR-gate, "NR30" is reduced by the barrier potential Vf of the diode "DIG". The fields applied to the gate oxide films of the field effect transistors in the NOR-gate "NR30", are relaxed, which results in the reduction in the tunneling current flowing through the gate oxide films of the field effect transistors in the NOR-gate "NR30".

In this embodiment, the potentials of the power nodes are uniformly shifted to suppress the band-to-band leak current. It is also possible to optionally set the substrate potential of the field effect transistors in each circuit block, for suppressing both the band-to-band leak current and the sub-threshold current.

In each circuit block, the field effect transistors are selected for the required circuit function, wherein parameters of the transistors are optimized, for which reason the counter-measures to leakage of the currents may be different in the respective circuit blocks. For example, in the memory cell, the gate threshold voltage of the field effect transistor is set so high as to ensure data holding characteristics with a high priority, which results in the effective suppression to the sub-threshold leak current. If the present invention is applied to the memory cell, it might be preferable to select the circuit configuration suitable for suppressing the band-to-band leak current.

In the peripheral logic circuit region, the gate threshold voltages of the field effect transistors air set so low as to ensure the high speed performance with a high priority. If the present invention is applied to the peripheral logic circuit region then the circuit configuration suitable for suppressing the sub-threshold current may be preferable.

The present invention may also be applicable to other circuit blocks than the logic circuit and the memory cell. For example, the present invention may also be applicable to the latch circuit including flip-flop circuits mainly. In this case, the same counter-measure to suppress the leakage of current as the memory cell including the flip-flop circuits may also be applicable.

The issue of whether the priority is given to the suppression to the band-to-band leak current and the suppression to the sub-threshold leak current may be decided depending on the required characteristics of the circuit block, for example, the gate threshold voltages of the field effect transistors and the potential difference between the drain and gate thereof.

The above high voltage supply circuit "SUPV" may optionally be common to a plurality of the circuit blocks. The above low voltage supply circuit "SPUG" may optionally be common to a plurality of the circuit blocks.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor device comprising:

at least a circuit block including field effect transistors; and a potential supplying circuit supplying one of a predetermined power potential to said at least a circuit block in an active mode, and said potential supplying circuit further shifting by an independent barrier voltage one of said predetermined power potential and said predetermined ground potential to reduce a potential difference between said predetermined power potential and said predetermined ground potential for supplying said shifted potential to said at least a circuit block in a static mode.

2. The semiconductor device as claimed in claim 1, wherein said potential supplying circuit shifts a source potential of first one of said field effect transistors, and said first one is in an OFF-state in said static mode.

3. The semiconductor device as claimed in claim 1, wherein said potential supplying circuit further comprising:

a current path between an internal ground node in said at least circuit block and an external ground terminal;

an n-channel MOS field effect transistor being in an OFF-state in said static mode and also being in an ON-state in said active mode; and a diode having an anode connected to said ground node and a cathode connected to said external ground terminal.

4. The semiconductor device as claimed in claim 1, wherein said potential supplying circuit further comprising:

a current path between an internal power node in said at least circuit block and an external power terminal;

a p-channel MOS field effect transistor being in an OFF-state in said static mode and also being in an ON-state in said active mode; and a diode having an anode connected to said external power terminal and a cathode connected to said power node.

5. The semiconductor device as claimed in claim 1, wherein said at least circuit block comprises an array of memory cells, and said potential supplying circuit supplies a potential to one of a power node and a ground node of said memory cell.

6. The semiconductor device as claimed in claim 5, wherein said array further includes a pre-charge circuit for pre-charging bit lines of said array, and said potential supplying circuit supplies a potential to a power node of said pre-charge circuit.

7. The semiconductor device as claimed in claim 1, wherein said threshold voltages of said field effect transistors are set so high as to suppress a sub-threshold and current.

8. The semiconductor device as claimed in claim 1, wherein said potential supplying circuit supplies a substrate potential to said field effect transistor which has a source connected to one of a power node and a ground node of said at least circuit block.

9. The semiconductor device as claimed in claim 1, wherein said at least circuit block has such a logic structure that a state of said at least circuit block is independent from conductive states of said field effect transistors in said static mode.

10. The semiconductor device as claimed in claim 1, wherein the independent barrier voltage is generated by a p-n junction of a diode.

11. A semiconductor device, comprising:

a bit line;

a plurality of SRAM cells each coupled to said bit line;

a power source line coupled to said SRAM cells;

a potential supplying circuit supplying a power source to said power source line in an active mode, and said potential supplying circuit further supplying a shifted power source to said power source line in a static mode, said shifted power source being generated by shifting said power source.

12. The device as claimed in claim 11, wherein said power source is shifted by an independent barrier voltage.

13. A semiconductor device, comprising:

first and second bit lines;

a plurality of SRAM cells each coupled between said first and second bit lines, each of said SRAM cells having;

first and second transfer gates coupled to said first and second bit lines, respectively;

a first p-channel transistor coupled between a first power source line and said first transfer gate and having a control gate coupled to said second transfer gate;

a first n-channel transistor coupled between said first transfer gate and a second power source line and having a control gate coupled to said second transfer gate;

a second p-channel transistor coupled between said first power source line and said second transfer gate and having a control gate coupled to said first transfer gate; and a second n-channel transistor coupled between said second transfer gate and said second power source line and having a control gate coupled to said first transfer gate; and a potential supplying circuit supplying a power source to one of said first and second power source lines in an active mode, and said potential supplying circuit further supplying a shifted power source to one of said first and second power source lines in a static mode, said shifted power source being generated by shifting said power source to reduce potential difference between voltages supplied with said first and second power source lines in said active mode.

14. The device as claimed in claim 13, wherein said second power source line is coupled to backgates of said first and second n-channel transistors and said first and second transfer gates.

15. The device as claimed in claim 13, wherein a ground source line independent from said second power source line is coupled to backgates of said first and second n-channel transistors and said first and second transfer gates.

16. The device as claimed in claim 13, wherein said first power source line is coupled to backgates of said first and second p-channel transistors.

17. The device as claimed in claim 13, wherein said shifted power source is shifted by an independent barrier voltage.

* * * * *